United States Patent
Wik et al.

(10) Patent No.: US 6,370,078 B1
(45) Date of Patent: *Apr. 9, 2002

(54) WAY TO COMPENSATE THE EFFECT OF COUPLING BETWEEN BITLINES IN A MULTI-PORT MEMORIES

(75) Inventors: Thomas R. Wik, Livermore; Ghasi R. Agrawal, San Jose, both of CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/740,604

(22) Filed: Dec. 19, 2000

Related U.S. Application Data

(63) Continuation-in-part of application No. 09/524,734, filed on Mar. 14, 2000.

(51) Int. Cl.⁷ .................................................. G11C 8/00
(52) U.S. Cl. ..................... 365/230.05; 365/69; 365/156
(58) Field of Search ..................... 365/230.05, 230.06, 365/156, 190, 189.02, 230.08, 69, 202, 206

(56) References Cited

U.S. PATENT DOCUMENTS 5,287,322 A * 2/1994 Rastegar ................. 365/230.05
6,233,197 B1 * 5/2001 Agrawal et al. ........ 365/230.05

FOREIGN PATENT DOCUMENTS

JP              363010396 A * 1/1988 ........... G11C/11/34

* cited by examiner

*Primary Examiner*—David Nelms
*Assistant Examiner*—David Lam

(57) ABSTRACT

The present invention is directed to a system and method of compensating for coupling capacitance between bit lines in multi-port memories. The complementary bit lines are switched between a core cell and a modified core cell. The modified core cell may invert the connections to the access transistors. This results in the writing of data into the cell correctly while compensating for coupling capacitance.

29 Claims, 4 Drawing Sheets

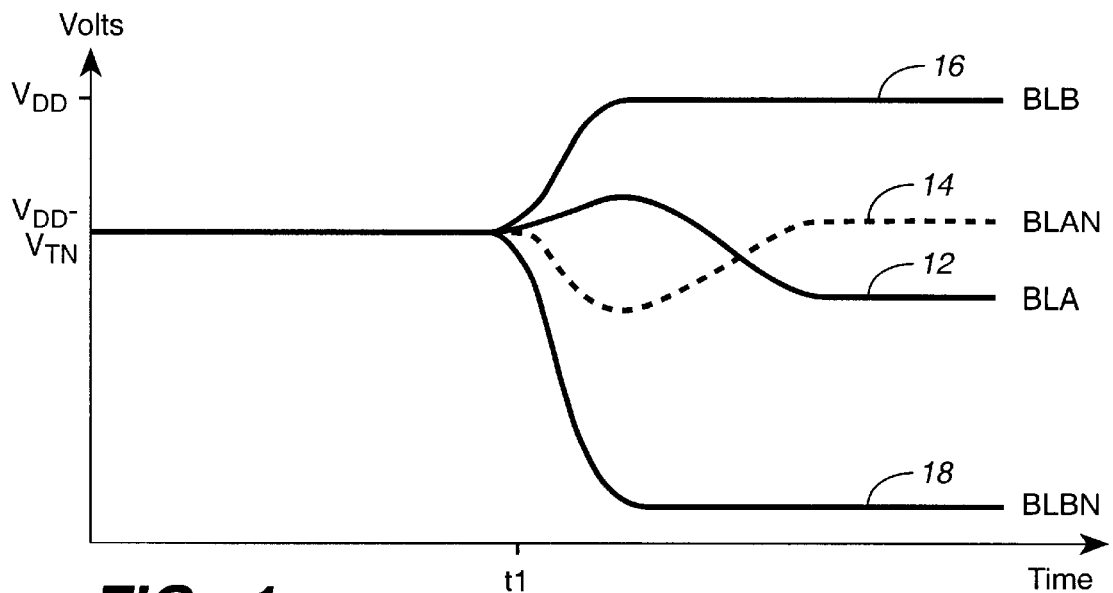
FIG._1
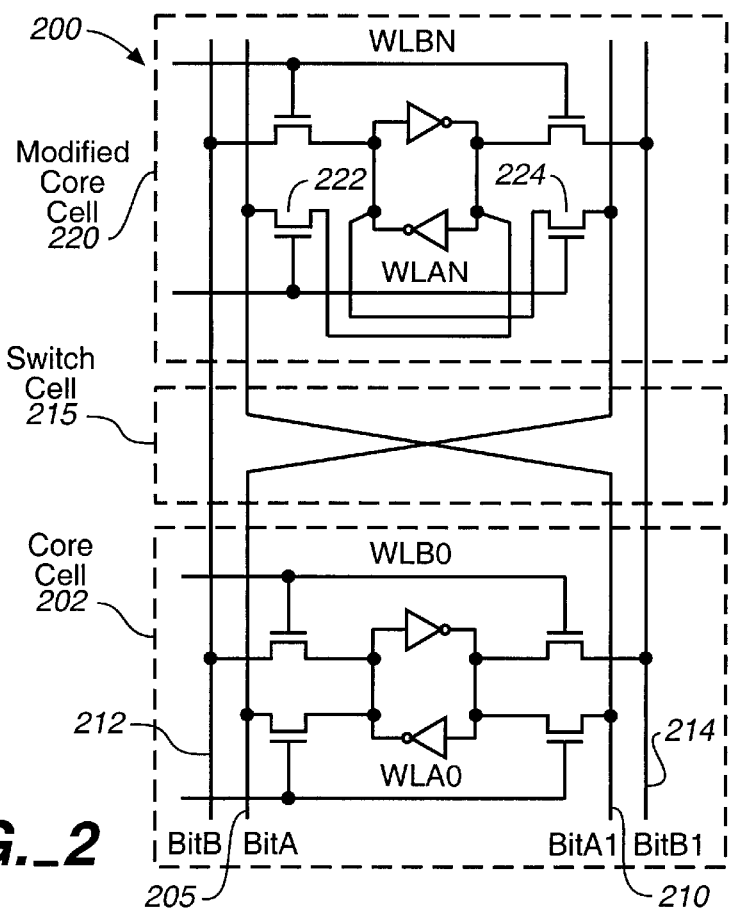
FIG._2

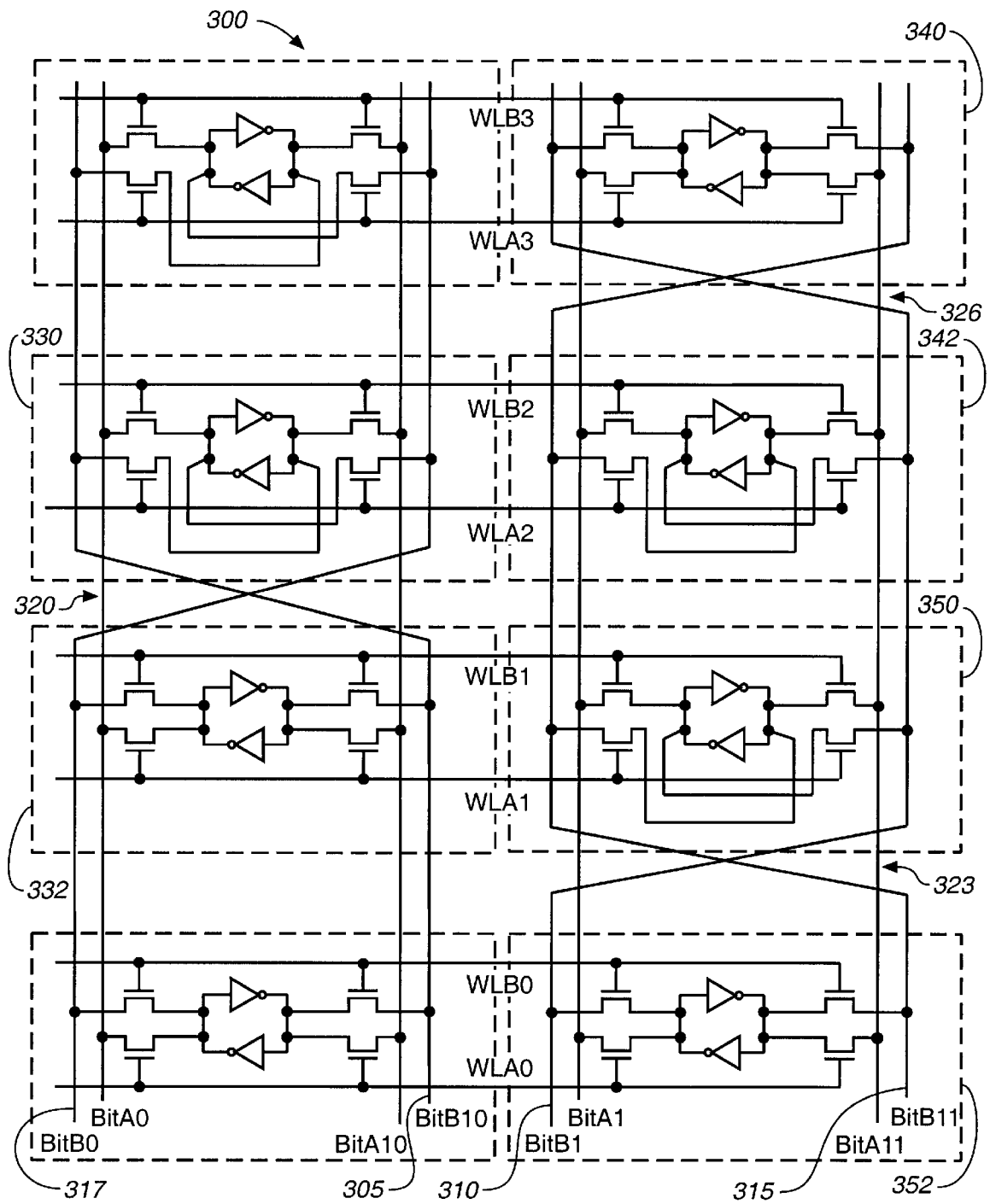
FIG._3

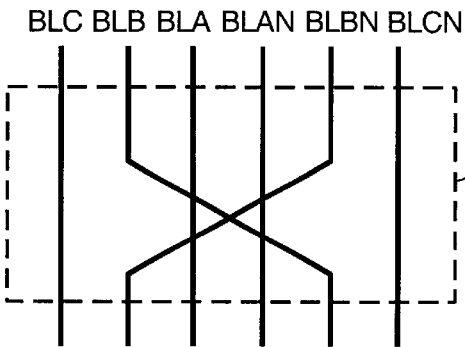
FIG._4A
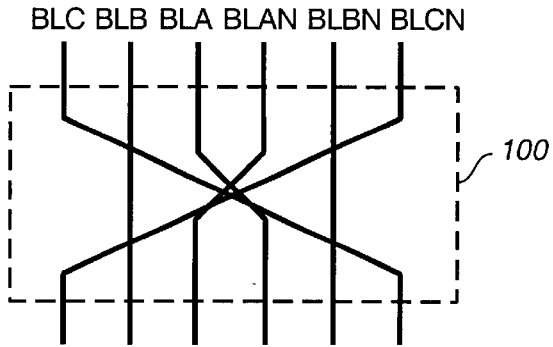
FIG._4B
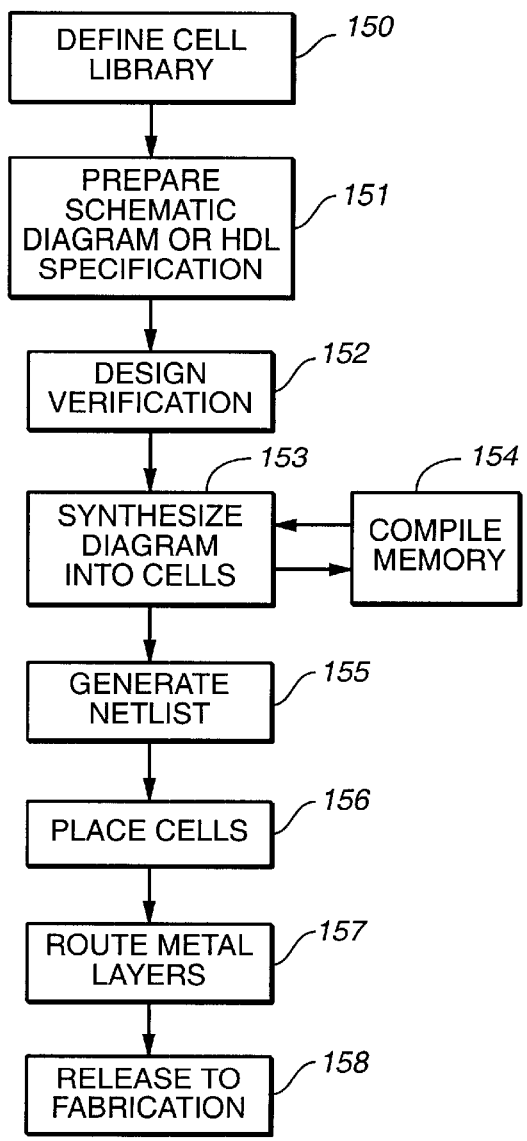
FIG._5

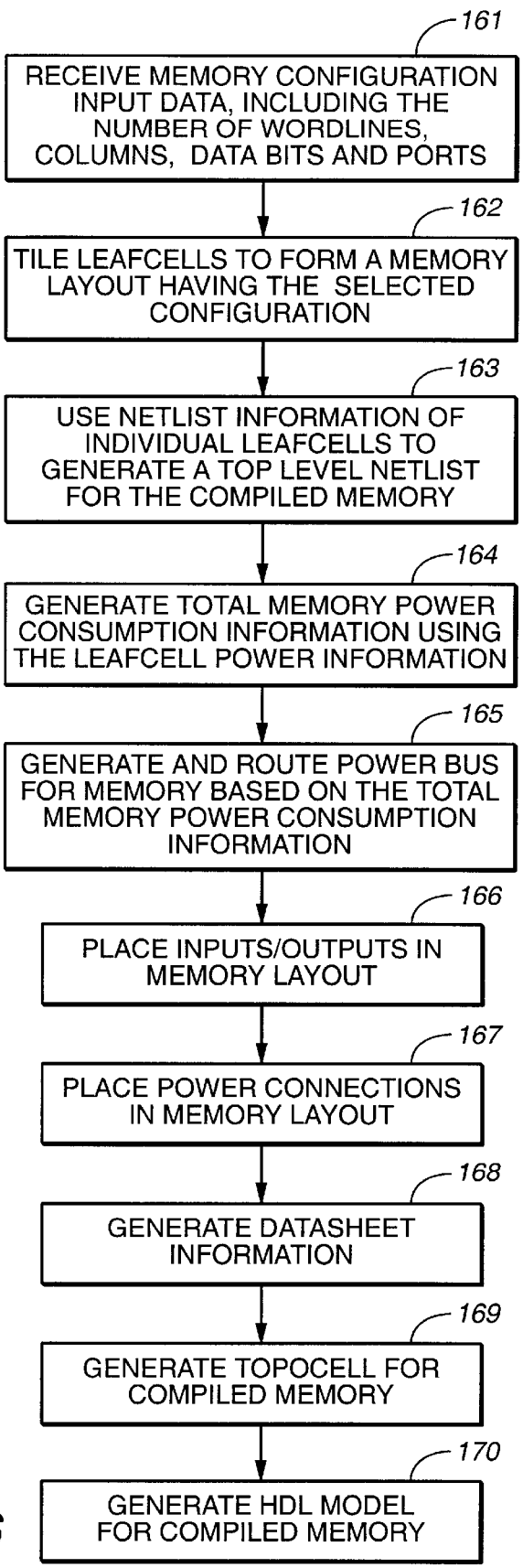
FIG._6

WAY TO COMPENSATE THE EFFECT OF COUPLING BETWEEN BITLINES IN A MULTI-PORT MEMORIES

CROSS REFERENCE TO RELATED APPLICATION

The present application is a continuation-in-part of U.S. patent application Ser. No. 09/524,734 filed on Mar. 14, 2000. Said U.S. patent application Ser. No. 09/524,734 is hereby incorporated by reference in its entirety

FIELD OF THE INVENTION

The present invention relates generally to the field of semiconductor memories and more particularly to a novel method and apparatus for compensating for the effect of coupling between bit lines in multi-port memories.

BACKGROUND OF THE INVENTION

In high density semiconductor memories, coupling capacitance between adjacent bit lines in the memory can corrupt the data that is written to or read from the memory. Two methods of avoiding the effects of coupling capacitance include providing extra spacing between the bit lines and shielding one bit line from the next bit line with power and ground conductors during layout of the memory. However, these methods are costly in terms of silicon area for high density memories. Moreover, even with proper spacing, it is often difficult to completely eliminate capacitive coupling.

U.S. Pat. No. 5,140,556 to Cho et al. discloses a single-port dynamic random access memory (DRAM) circuit having dummy cells, which are connected to twisted bit lines. The memory is divided into four equal segments, and the bit lines of adjacent memory cells are twisted between the segments to compensate for capacitive coupling. However, this patent does not address avoidance of coupling capacitance between bit lines of two or more ports, which are part of the same memory cell, in a multi-port memory. In addition, while this implementation can be used with custom memory devices, it is difficult, if not impossible, to implement this method in a memory compiler for embedded memory devices in which the number of rows in the memory is variable.

A method of compensating for coupling capacitance between bit lines of different ports of the same memory cell has been used by LSI Logic Corporation in their embedded memory cores. With multi-port memories, capacitive coupling can occur between the bit lines of different ports during simultaneous access (writing or reading) of different cells of the same column of the memory. With an LSI dual-port memory core, the internal bit lines (BLA and BLAN) of one of the two ports were switched (i.e. crossed) at the middle of each column of the memory. By crossing the internal bit lines of one port at the middle of the memory, the effects of capacitive coupling along the upper half of the memory is cancelled out by the capacitive coupling along the lower half of the memory.

Since the bit lines of one port were switched in the middle of the memory for one port, the data inputs and data outputs of that port were inverted when writing to or reading from the upper half of the memory, which saw an inversion in the crossed bit lines at the middle of the memory. This ensured that the same data could be written to and read from the upper half of the memory through the port with switched bit lines and through the port without switched bit lines.

Unfortunately, the above method of compensating for coupling capacitance has some inherent difficulties. In memory compiler applications, where the number of rows in the memory is variable, it is very difficult for the compiler algorithm to locate the bit line crossing location exactly in the middle of each column. Also, the row address bits, which identify whether the upper or lower half of the memory is being accessed, had to be decoded to determine whether the data inputs or data outputs had to be inverted for the port having the switched bit lines. This decoding can be very tedious and can become very difficult to implement in a memory compiler environment where the number of physical rows can vary.

To optimize the address decoding logic, the memory compiler algorithm is written to find a tolerance capacitance below which coupling between adjacent bit lines has no significant effect. This tolerance capacitance is then correlated to a maximum number of physical rows along which there is no compensation. The total memory array is then divided into two parts such that the maximum difference between the two parts is less than or equal to the tolerance size. Keeping this criterion in mind, the algorithm chooses a switch point to optimize the address decoding.

Although this algorithm reduces complexity of the address decoding somewhat, it is difficult for the memory compiler algorithm to find a good and reliable tolerance capacitance since the tolerance capacitance can vary significantly with process variation, amount of circuit noise and power bumps. The chances of silicon failure using the above-technique can be very high in some applications.

Consequently, it would be advantageous if an improved system and method existed compensating for coupling capacitance between adjacent bit lines in large multi-port memories. Further, it would be advantageous if a faster system and method existed for read/write operations while providing coupling capacitance compensation. It would be also be advantageous if a system and method existed for coupling capacitance compensation which is less restrictive in circuit design and did not require selection of an address bit.

SUMMARY OF THE INVENTION

Accordingly, the present invention is directed to a system and method for compensating for coupling capacitance between adjacent bit lines in multi-port memories. The present invention includes utilizing a modified core cell on the bit lines after switching the bit lines for the internal port. The modified core cell may have inverted connections to access transistors which results in writing the desired data into the cell correctly and more quickly.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 1 depicts an embodiment of a graph illustrating the effects of capacitive coupling between bit line pairs in a multi-port memory;

FIG. 2 is a schematic diagram of an embodiment of a multi-port semiconductor memory of the present invention;

FIG. 3 is a schematic diagram of an embodiment of a capacitive coupling compensation circuit for adjacent column coupling of the present invention;

FIGS. 4A and 4B are embodiments of schematic illustrations illustrating alternative bit line switch cells for a three port memory;

FIG. 5 is a flow chart which illustrates a typical process of designing and fabricating a semiconductor integrated circuit according to one embodiment of the present invention; and FIG. 6 is a flow chart which illustrates the various steps performed by a memory compiler in the process shown in FIG. 5, according to one embodiment of the present invention.

DETAILED DESCRIPTION OF THE INVENTION

Reference will now be made in detail to an embodiment of the invention, examples of which are illustrated in the accompanying drawings.

A multi-port memory has a plurality of memory cells arranged in columns and rows. Each column has a pair of complementary bit lines for each port, which are routed parallel to one another through the memory cells in that column. Each memory cell is enabled through appropriate, address decode logic.

In large, multi-port semiconductor memories, there is coupling capacitance between the adjacent pairs of bit lines of different ports within each memory cell. In high density memories, this coupling capacitance can become large enough to affect the functionality of the memory.

FIG. 1 is a graph illustrating the capacitive coupling between pairs of bit lines for a memory having two ports, port A and port B, during simultaneous write and read operations. Lines 12 and 14 represent a pair of complementary bit lines BLA and BLAN for port A. Lines 16 and 18 represent a pair of complementary bit lines BLB and BLBN for port B.

Prior to a read or write operation, each bit line is precharged to a reference level, such as a gate-source threshold voltage VTN less than a supply voltage VVDD. At time T1, a logic "one" is written to a particular memory cell through port B, with BLB line 16 going high and BLBN line 18 going low. Simultaneously, a read operation is performed, which reads a logic "zero" from another memory cell in the same column through port A. Because of capacitive coupling between BLB line 16 and BLA line 12 (and between BLBN line 18 and BLAN line 14) the port A bit lines BLA and BLAN initially go in the wrong direction and recover later on. The sense amplifiers coupled to bit lines BLA and BLAN therefore start reading the wrong data. Even though bit lines BLA and BLAN recover over time, the sense amplifier also takes some time to recover. This reduces the timing margin at the memory output latch and many times can cause the wrong data to be latched. In any case, this capacitive coupling causes an adverse increase in the access time specification for the memory.

Referring now to FIG. 2, a schematic diagram of an embodiment of a portion of multi-port semiconductor memory 200 of the present invention is shown. The portion of multi-port semiconductor memory 200 may compensate for coupling capacitance between adjacent bit line pairs of different ports within each column of memory. The embodiment as shown in FIG. 2 has dual ports, however, multiple ports may be incorporated in accordance with the present invention by one of ordinary skill in the art without departing from the scope and spirit of the present invention.

Memory 200 may include ports A and B with complementary bit lines Bit A 205 and Bit AI 210 for port A and complementary bit lines Bit B 212 and Bit BI 214 for port B. Memory 200 may further include a core cell 202, a switch cell 215, and a modified core cell 220. Core cell may include four transistors and two inverters. Modified core cell 220 may be similar to core cell 202 with inverted connections to the access transistors 222, 224.

Compensation of coupling capacitance may be achieved by switching the bit lines (crossing the bit lines over one another). Switching of the bit lines inverts the relative polarity of the bit lines. Referring to FIG. 2 once again, bit lines Bit A 205 and Bit AI 210 of core cell 202 may be switched at a switch cell 215 and then may be connected to a modified core cell 220.

The modified core cell may have inverted connections to access transistors 222 and 224. This may be advantageous as this may not require maintaining data input and data output inversions. This may remove the requirement of selecting an address bit to control the data input and data output inversion. Also, memory 200 of the present invention may compensate for coupling capacitance without requiring selection of an address bit for a specific compiler in advance during circuit design. When the bit lines Bit A 205 and Bit AI 210 are switched by the switch cell 215 and the connections inside the core cell are switched, the desired data may be written into the cell correctly. The data written to the cell in memory 200 of the present invention may be accomplished more quickly as there may not be any uncompensated capacitance nor will any time be spent multiplexing an inverted output with non-inverted output.

The switch cell 215 of the present invention is highly advantageous. Without the limitation of maintaining data input and data output inversions, the switch cell allows for easier design of multi-port memories. The switch cell 215 of the present invention may be placed nearly anywhere when designing the placement of memory leafcells. The switch cell of the present invention may not be dependent upon the address bit, therefore design of multi-port memories is simplified. The modified core cell 220 may be placed in an area next to the switch cell 215.

The switching cell 215 as shown in FIG. 2 is shown as a separate entity from the core cell 202 and modified core cell 220. However, it should be understood by one of ordinary skill in the art that the functionality of the switching cell (crossing of a pair of bit lines) may be accomplished within a core cell 202 and 220 without departing from the scope and spirit of the present invention. Placement of the switching cell within the core cell 202 and modified core cell 220 may also be accomplished without adding to the area consumed by the memory 200.

The method of the present invention may also be utilized in compensating for adjacent column coupling. Referring now to FIG. 3, an embodiment of capacitive coupling compensation system 300 for adjacent column coupling of the present invention is shown. The embodiment of a capacitive coupling compensation system 300 is shown with two columns and four wordlines, however, other types of multi-port memory systems may be incorporated in accordance with the present invention by one of ordinary skill in the art without departing from the scope and spirit of the present invention. Utilizing the switching cell and modified core cell as described in FIG. 2, the user may be able to place the switches at different locations in adjacent columns in order to compensate for adjacent column coupling.

For example, the embodiment of the capacitive coupling compensation system includes columns pairs of memory cells. The pairs of memory cells include a core cell and a modified core cell with a switching cell in between the cells as described in FIG. 2. Rather than place the columns side by side with each other, the columns may be staggered in accordance with the present invention. In this way, the switching cells may be offset from each other. This may be beneficial as the coupling between adjacent column bit lines may be compensated.

As shown in FIG. 3, bit line BitBI0 305 may be coupled with bit line Bit B1 310 and BitBI1 315 equally (similarly Bit B0 317 may be coupled with Bit B1 310 and Bit BI1 315 equally) and may not be affected by their transitions. This may be accomplished by placing switch cells 320–326 between core cells 330 and 332, 340 and 342, and 350 and 352. It should be understood by one of ordinary skill in the art that adjacent column coupling compensation in accordance with the present invention may be accomplished by various designs other than the one shown in FIG. 3 without departing from the scope and spirit of the present invention. The design shown in FIG. 3 being only an embodiment of the present invention.

As mentioned above, the present invention may be applied to a memory having any number of multiple ports. FIGS. 4A and 4B illustrate examples of switch cells for memories having three data ports. In FIG. 4A, there are three pairs of complementary bit lines, BLA, BLAN, BLB, BLBN and BLC, BLCN. There is one bit line pair for each of the three data ports. A switch cell 100 may cross the bit lines in bit line pair BLB, BLBN so that their relative polarity inverts at the location of the switch cell 100. This compensates for capacitive coupling between bit lines BLB and bit lines BLA and BLC and between bit line BLBN and bit lines BLAN and BLCN. Alternatively, a switch cell 100 may cross the bit lines of bit line pairs BLA, BLAN and BLC, BLCN as shown in FIG. 4B.

The method of compensating for capacitive coupling of the present invention may be implemented into a memory compiler. A memory compiler is formed of a software program and an accompanying database that are typically provided by a semiconductor manufacturer to its customer for assisting the customer in integrating memories into the customer's logic designs. For example, the semiconductor manufacturer may provide the memory compiler with a semiconductor cell library containing an embedded memory cell for an application specific integrated circuit (ASIC).

FIG. 5 is a flow chart, which illustrates a typical process of designing and fabricating a semiconductor integrated circuit according to one embodiment of the present invention. Semiconductor integrated circuits are designed and fabricated by first selecting or defining a cell library, at step 150. The cell library is typically defined by the manufacturer of the integrated circuit.

Next, the logic designer prepares a schematic diagram or hardware description language (HDL) specification of a logical circuit, at step 151, in which instances of the cells in the cell library are selected and interconnected to form a desired logical function. For example, the logic designer may select the embedded memory cell and define its configuration, such as the number of rows (i.e., wordlines), the number of columns, the number of ports and the number of data bits per port. The schematic diagram or HDL specification is then passed to a computer-aided design verification tool, which assists the logic designer in verifying the desired logical function, at step 152. The design verification performed at step 152 often leads to changes in the schematic diagram or HDL specification prepared at step 151.

Once the schematic diagram or HDL specification is complete, it is passed to a series of additional computer-aided design tools, beginning at step 153, which assist the logic designer in converting the schematic diagram or HDL specification to a semiconductor integrated circuit layout definition that can be fabricated. At step 153, the schematic diagram or HDL specification is synthesized into the cells of the cell library defined in step 150. If the schematic diagram or HDL specification includes a memory, the memory is compiled by the memory compiler, at step 154, as part of the synthesizing process.

The memory compiler generates a "topocell", a memory datasheet and an HDL model for the memory. The topocell contains various information about the memory, such as rules regarding the routing of signals over the memory, output connection information and power connection information. This information is used in later chip-level placement and routing fabrication steps. The memory database includes timing, power and other relevant information about the physical operation of the compiled memory, which the logic designer uses in the chip-level design process. The HDL model can include a Verilog model, a VHDL model or an IKOS model, for example, which is used in chip-level logical simulations. The steps performed by the memory compiler are described in more detail below with reference to FIG. 5.

At step 155, the design tools generate a netlist of the selected cells and the interconnections between the cells. At step 156, the cell instances are "placed" to form a layout pattern for the integrated circuit by arranging the cells in selected locations. The cell instances can be placed manually or by an automatic placement tool. Once all of the cell instances have been placed, the logic designer continues the design process by routing electrical interconnections between the placed cell instances along routing paths within the various metal routing layers, at step 157. If there are no further design changes to the schematic diagram or HDL specification, then the layout pattern, the corresponding cell definitions and the routing data can be released to fabrication, at step 158.

FIG. 6 is a flow chart which illustrates the operation of the memory compiler in greater detail. The memory compiler includes two major components, a software program and a database, which defines a library of "leafcells". These components are typically stored on a computer readable medium, such as a floppy disc, a hard disc, a magnetic tape or a random access memory, for example, which an be accessed by the computer-aided design tools. The software program includes a plurality of instructions which, when executed by a computer, cause the computer to perform the steps shown in FIG. 6.

The leafcells define the various component parts of the memory and have predefined inputs and outputs. Examples of leafcells include a memory core cell, and a switch cell, for example. Each leafcell in the library has a variety of components. These components include a layout of the transistors and other elements contained within the leafcell, a netlist of the electrical interconnections between the transistors and other elements within the leafcell, and the physical size of the leafcell. The library of leafcells also includes a table of timing information, a table of power consumption information, and an HDL model template for various configurations of the compiled memory.

During operation, the memory compiler's software instructions perform steps 161–170 in FIG. 6. At step 161, the memory compiler receives memory the configuration input data, such as the number of wordlines, columns, ports and data bits per port. Based on the configuration input data, the memory compiler "tiles" individual instances of the leaf cells, at step 162, to form a memory layout having the selected configuration. Electrical connections between the leafcells are accomplished through abutment of adjacent leafcells, for example. Alternatively, a routing step can be performed to route the interconnections. In addition, the memory compiler crosses the chosen pair (or pairs) of bit lines so that their relative polarity inverts between a core cell and a modified core cell. The memory compiler may cross the bit lines by placing switch cells at the appropriate locations. In alternative embodiment, the switch cell may be placed within a core cell and a modified core cell while providing the same functionality of crossing a pair of bit lines. In an alternative embodiment, the memory compiler may pick the appropriate core cell or modified core cell for placement of the switching cell.

Once the leafcells have been tiled to form a memory layout, at step 162, the memory compiler uses the netlist information of the tiled leafcells to generate a top level netlist for the compiled memory, at step 163. This netlist includes a list of the inputs and outputs of each leafcell instance and the electrical interconnections between these inputs and outputs. The top level netlist can be used by later design verification tools to run "layout versus schematic" (LVS) checks and layout design rule checks (DRC), for example.

At step 164, the memory compiler generates power consumption information for the entire memory using the power consumption information of each leafcell instance. At step 165, the memory compiler generates a power bus and places the power bus around the compiled memory within the memory layout pattern, based on the total power consumption information generated in step 164.

At step 166, the memory compiler defines input and output connection information for the compiled memory within the memory layout pattern, such as the address, data and write/read control inputs for each port. This connection information is used later on when the compiled memory is placed at the chip level. At step 167, the memory compiler defines power connection information for the compiled memory, which is used to supply power to the memory at the chip level.

At step 168, the memory compiler generates data sheet information for the compiled memory. The data sheet information includes timing, power and other relevant information about the compiled memory, which the customer can use during the design process at the chip level. At step 169, the memory compiler generates a topocell for the compiled memory. As discussed above, the topocell includes information about input and output connections, power connections and rules regarding conductor routing in various metal layers over the memory. The topocell is used by the chip level placement and routing tools; At step 170, the memory compiler generates the HDL model for the compiled memory. This model can then be used during chip level design verification simulations.

As can be seen from the flow chart of FIG. 6, the method of compensating for capacitive coupling of the present invention can be implemented easily and reliably in a memory compiler application. Although the present invention has been described with reference to preferred embodiments, workers skilled in the art will recognize that changes may be made in form and detail without departing from the spirit arid scope of the invention. For example, various circuit configurations can be used to switch or cross bit lines. The present invention can be implemented in a variety of multi-port memory types, such as an SRAM. Also, the terms "row" and "column" used in the specification and the claims are interchangeable. Similarly, the term "coupled" can include a variety of connections, such as a direct connection or a connection through one or more intermediate elements.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A multi-port semiconductor memory comprising:

(a) at least two memory cells, said at least two memory cells including at least two pairs of complementary bit lines coupled to each of said at least two memory cells and to at least two data ports; and (b) a switching cell; wherein a second of said at least two memory cells has inverted connections to access transistors of said second memory cell compared to a first memory cell, said switching cell crossing a first pair of complementary bit lines across one another.

2. The multi-port semiconductor memory as claimed in claim 1, wherein said first pair of complementary bit lines is positioned between and electrically isolated from a second pair of complementary bit lines.

3. The multi-port semiconductor memory as claimed in claim 1, wherein a relative polarity of said first pair of bit lines is inverted after switching of said first pair of complementary bit lines.

4. The multi-port semiconductor memory as claimed in claim 1, wherein said second pair of bit lines has a relative polarity that is maintained without inversion.

5. The multi-port semiconductor memory as claimed in claim 1, wherein said switching cell is located within said at least two memory cells.

6. The multi-port semiconductor memory as claimed in claim 1, wherein each of said at least two memory cells include four transistors and two inverters, wherein each of said four transistors is connected to at least one bit line of said first and second pairs of complementary bit lines.

7. The multi-port semiconductor memory as claimed in claim 1, wherein a third pair of complementary bit lines are connected to a third data port and to each of at least two memory cells, said second pair of bit lines being positioned between said first pair of bit lines and wherein said second and third pairs of bit lines have a relative polarity within the pair that is maintained without inversion.

8. The multi-port semiconductor memory as claimed in claim 1, wherein a third pair of complementary bit lines are connected to a third data port and to each of at least two memory cells, said first pair of bit lines being positioned between said second pair of bit lines, said second pair of bit lines being positioned between said third pair of bit lines, said third pair of bit lines cross one another, said second pair of bit lines have a relative polarity within the pair that is maintained without inversion.

9. The multi-port semiconductor memory as claimed in claim 1, wherein the memory is a static random access memory.

10. A method of compensating for coupling capacitance in multi-port semiconductor memory, comprising:
  (a) connecting at least two memory cells via at least two pair of complementary bit lines;
  (b) switching a first pair of complementary bit lines between each of at least two memory cells; and
  (c) inverting connections to access transistors of a second memory cell, wherein coupling capacitance between said first pair of complementary bit lines and a second pair of complementary bit lines is compensated.

11. The method as claimed in claim 10, wherein said first pair of complementary bit lines is positioned between and electrically isolated from a second pair of complementary bit lines.

12. The method as claimed in claim 10, wherein a relative polarity of said first pair of complementary bit lines is inverted after switching of said first pair of complementary bit lines.

13. The method as claimed in claim 10, wherein said second pair of bit lines has a relative polarity that is maintained without inversion.

14. The method as claimed in claim 10, wherein each of said at least two memory cells include four transistors and two inverters, each of said four transistors being connected to at least one bit line of said first and second pairs of complementary bit lines.

15. The method as claimed in claim 10, wherein a third pair of complementary bit lines are connected to each of at least two memory cells, said second pair of bit lines being positioned between said first pair of bit lines and wherein said second and third pairs of bit lines have a relative polarity within the pair that is maintained without inversion.

16. The method as claimed in claim 10, wherein a third pair of complementary bit lines are connected to each of at least two memory cells, said first pair of bit lines being positioned between said second pair of bit lines, said second pair of bit lines being positioned between said third pair of bit lines, said third pair of bit lines cross one another, said second pair of bit lines have a relative polarity within the pair that is maintained without inversion.

17. A computer readable medium comprising a semiconductor memory compiler, said memory compiler comprising instructions which, when executed by a computer cause the computer to perform steps of:
  (a) tiling a plurality of memory core cells in a plurality of rows and columns for a memory layout pattern, said memory cells having at least two data ports, wherein each of the columns include at least two pairs of complementary bit lines, said two pairs of complementary bit lines being coupled to the memory cells;
  (b) placing a switching cell within said memory layout pattern for switching a first pair of complementary bit lines between pairs of memory cells; and
  (c) inverting connections to access transistors of a second memory cell of said pairs of memory cells, wherein coupling capacitance between said first pair of complementary bit lines and a second pair of complementary bit lines is compensated.

18. The computer readable medium of claim 17, wherein the memory compiler comprises instructions, which, when executed by a computer further cause the computer to perform the step of
  receiving memory configuration data, including a wordline input variable, which defines a number of the memory core cells that are tiled in each of the plurality of columns.

19. The computer readable medium of claim 17, wherein a relative polarity of said first pair of complementary bit lines is inverted after switching of said first pair of complementary bit lines.

20. The computer readable medium of claim 17, wherein said second pair of bit lines has a relative polarity that is maintained without inversion.

21. The computer readable medium of claim 17, wherein said switching cell is located within said memory cells.

22. The computer readable medium of claim 17, wherein each of said memory cells include four transistors and two inverters, wherein each of said four transistors is connected to at least one bit line of said first and second pairs of complementary bit lines.

23. The computer readable medium of claim 17, wherein a third pair of complementary bit lines are connected to a third data port and to said memory cells, said second pair of bit lines being positioned between said first pair of bit lines and wherein said second and third pairs of bit lines have a relative polarity within the pair that is maintained without inversion.

24. The computer readable medium of claim 17, wherein a third pair of complementary bit lines are connected to a third data port and to said memory cells, said first pair of bit lines being positioned between said second pair of bit lines, said second pair of bit lines being positioned between said third pair of bit lines, said third pair of bit lines cross one another, said second pair of bit lines have a relative polarity within the pair that is maintained without inversion.

25. A multi-port semiconductor memory system, comprising:
  (a) at least two columns of pairs of memory cells, said pairs of memory cells including at least two pairs of complementary bit lines coupled to each of said pairs of memory cells and to at least two data ports;
  (b) a switching cell placed among said pairs of memory cells; wherein a first column placement is staggered with respect to a second column providing a pattern in which said switching cells are offset.

26. The multi-port semiconductor memory system as claimed in claim 25, wherein said switching cell is placed within said pairs of memory cells.

27. The multi-port semiconductor memory system as claimed in claim 25, wherein each of said pairs of memory cells include four transistors and two inverters, wherein each of said four transistors is connected to at least one bit line of said first and second pairs of complementary bit lines.

28. The multi-port semiconductor memory system as claimed in claim 25, wherein a third pair of complementary bit lines are connected to a third data port and to each said pairs of memory cells, said second pair of bit lines being positioned between said first pair of bit lines and wherein said second and third pairs of bit lines have a relative polarity within the pair that is maintained without inversion.

29. The multi-port semiconductor memory system as claimed in claim 25, wherein a third pair of complementary bit lines are connected to a third data port and to each of at least two memory cells, said first pair of bit lines being positioned between said second pair of bit lines, said second pair of bit lines being positioned between said third pair of bit lines, said third pair of bit lines cross one another, said second pair of bit lines have a relative polarity within the pair that is maintained without inversion.

* * * * *